United States Patent
Ogawa et al.

(10) Patent No.: US 7,488,897 B2
(45) Date of Patent: Feb. 10, 2009

(54) HYBRID MULTILAYER SUBSTRATE AND METHOD FOR MANUFACTURING THE SAME

(75) Inventors: Nobuaki Ogawa, Moriyama (JP); Yoshihiko Nishizawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/734,522

(22) Filed: Apr. 12, 2007

(65) Prior Publication Data

US 2007/0178279 A1 Aug. 2, 2007

Related U.S. Application Data

(63) Continuation of application No. PCT/JP2005/018937, filed on Oct. 14, 2005.

(30) Foreign Application Priority Data

Oct. 22, 2004 (JP) .............................. 2004-308322

(51) Int. Cl.
*H05K 1/16* (2006.01)
(52) U.S. Cl. .................. 174/260; 174/258; 361/761
(58) Field of Classification Search ......... 361/761–764; 174/258, 260
See application file for complete search history.

(56) References Cited

U.S. PATENT DOCUMENTS

| | | | |
|---|---|---|---|
| 2003/0214027 A1 | 11/2003 | Nishitani et al. | |
| 2004/0251044 A1* | 12/2004 | Choi et al. | ................. 174/52.4 |
| 2006/0120058 A1* | 6/2006 | Fairchild et al. | ............ 361/761 |

FOREIGN PATENT DOCUMENTS

| | | |
|---|---|---|
| JP | 11-260964 | 9/1999 |
| JP | 11-317473 | 11/1999 |
| JP | 2003-304065 | 10/2003 |
| JP | 2003-309213 | 10/2003 |

OTHER PUBLICATIONS

Official Communication for PCT Application No. PCT/JP2005/018937; mailed on Jan. 17, 2006.

* cited by examiner

*Primary Examiner*—Jeremy C Norris
(74) *Attorney, Agent, or Firm*—Keating & Bennett, LLP

(57) ABSTRACT

A hybrid multilayer substrate includes a cavity in a laminate structure formed of a resin portion and a ceramic multilayer substrate, the resin portion has a protrusion portion, the ceramic multilayer substrate has a penetrating hole, and the cavity is formed by fitting the protrusion portion of the resin portion to an end portion of the penetrating hole of the ceramic multilayer substrate.

7 Claims, 8 Drawing Sheets

HYBRID MULTILAYER SUBSTRATE AND METHOD FOR MANUFACTURING THE SAME

BACKGROUND OF THE INVENTION

1. Field of the Invention

The present invention relates to hybrid multilayer substrates and methods for manufacturing the same, and more particularly, to a highly reliable hybrid multilayer substrate having a cavity in which an electronic component is mounted with high accuracy, and to a method for manufacturing the hybrid multilayer substrate.

2. Description of the Related Art

A related wiring substrate having a cavity is disclosed in Japanese Unexamined Patent Application Publication No. 2003-309213 (Patent Document 1). This wiring substrate includes a ceramic core substrate having a penetrating hole, a resin insulating layer which is provided on the bottom surface of this ceramic core substrate and which blocks the penetrating hole so as to define a cavity, an IC chip mounted in the cavity defined by the resin insulating layer, and a filling material which is filled around the IC chip to seal it in the cavity.

When the above wiring substrate is manufactured, after the ceramic core substrate having a penetrating hole is formed, the IC chip is aligned in the penetrating hole of the ceramic core substrate, and the filling material is then filled in a gap between the IC chip and the penetrating hole so as to unite the IC chip and the ceramic core substrate in the penetrating hole. Next, by a conventional method, a resin insulating layer having via holes is formed on the rear surface of the ceramic core substrate.

However, with the wiring substrate disclosed in Patent Document 1, since the resin insulating layer having via holes is provided for the IC chip fixed in the penetrating hole of the ceramic core substrate by the filling material, and a self-alignment function of the IC chip cannot be used during mounting, terminals of the IC chip and the via holes (electrodes) of the resin insulating layer cannot be easily and accurately provided, and as a result, it is difficult to obtain electrical conduction between the IC chip and the electrodes provided in the resin insulating layer. Furthermore, since IC chips are multifunctional in recent years, in ICs for flip-chip assembly, the pitch between terminals is decreased, the size of bumps is decreased, and the number of pins is increased. As a result, it is increasingly difficult to obtain electrical conduction between the IC chip and the electrodes provided in the resin insulating layer.

In order to use the self-alignment function of the IC chip, it is necessary to form a cavity 3 in advance by thermocompression bonding of a resin insulating layer 2 having electrodes 2A to a ceramic substrate 1 having a penetrating hole as shown in FIG. 11. Furthermore, concomitant with the increase in the number of pins, due to the narrower pitch and smaller bumps of an IC chip, the electrodes 2A must be formed with high accuracy in the cavity 3 so as to reduce the shift in position of the electrodes 2A to as small as possible.

However, as shown in FIG. 11, when the resin insulating layer 2 is bonded to the ceramic substrate 1 by thermocompression bonding, the resin insulating layer 2 flows during the thermocompression bonding, the electrodes 2A located in the cavity 3 are shifted in the horizontal direction thereby, and thus, it is difficult to form the electrodes 2A with high accuracy. This tendency becomes more apparent as the number of films which define the resin insulating layer 2 is increased, and as a result, the reliability of connection may not be satisfactory in some cases.

SUMMARY OF THE INVENTION

To overcome the problems described above, preferred embodiments of the present invention provide a hybrid multilayer substrate and a method for manufacturing the same, the hybrid multilayer substrate having improved positional accuracy of the terminal electrodes provided in the bottom surface of the cavity and being capable of significantly improving the reliability in connection with a mounted component.

According to a preferred embodiment of the present invention, a method for manufacturing a hybrid multilayer substrate having a cavity in a laminate structure made of a resin portion and a ceramic substrate includes the steps of forming a resin portion having a protrusion portion and a ceramic substrate having a penetrating hole, and bonding the resin portion to the ceramic substrate so as to fit the protrusion portion of the resin portion to an end portion of the penetrating hole of the ceramic substrate the resin portion. Accordingly, the ceramic substrate and the resin portion are united to define a cavity using an upper surface of the protrusion portion as a bottom surface.

In addition, the resin portion and the ceramic substrate are preferably compression-bonded to each other.

The method for manufacturing a hybrid multilayer substrate preferably further includes the step of placing a first chip type electronic component in the cavity.

Preferably, the method for manufacturing a hybrid multilayer substrate further includes the step of sealing the first chip type electronic component placed in the cavity with a resin.

The ceramic substrate is preferably defined by a ceramic multilayer substrate including ceramic layers laminated to each other, and in which a predetermined conductive pattern is provided inside the ceramic multilayer substrate and on a surface thereof.

Preferably, the ceramic layers are made of a low temperature sintered ceramic, and a conductive material primarily composed of silver or copper is used for the conductive pattern.

A terminal electrode is preferably provided in the surface of the resin portion opposite to the surface bonded to the ceramic multilayer substrate, and this terminal electrode is connected to the conductive pattern for the ceramic multilayer substrate via a via conductor provided in the resin portion.

A region in which a conductive pattern is not provided at the interface between the resin portion and the ceramic substrate and on the bottom surface of the cavity is provided to extend from an inside wall surface of the cavity, which is used as the center, to a position at least about 150 μm from the wall surface of the cavity in every direction.

Preferably, the method for manufacturing a hybrid multilayer substrate further includes the step of placing a second chip type electronic component in the resin portion.

Preferably, a hybrid multilayer substrate having a cavity in a laminate structure made of a resin portion and a ceramic substrate is provided, in which the resin portion includes a protrusion portion and the ceramic substrate includes a penetrating hole, and the cavity is defined by an upper surface of the protrusion portion of the resin portion and a wall surface of the penetrating hole of the ceramic substrate.

Preferably, a first chip type electronic component is disposed in the cavity.

Preferably, the first chip type electronic component disposed in the cavity is sealed with a resin.

Preferably, the ceramic substrate is a ceramic multilayer substrate including ceramic layers laminated to each other, and a predetermined conductive pattern is provided inside the ceramic multilayer substrate and on a surface thereof.

Preferably, each of the ceramic layers are made of a low temperature sintered ceramic layer, and the conductive pattern is made of a conductive material primarily composed of silver or copper.

A terminal electrode is preferably provided in the surface of the resin portion opposite to the surface bonded to the ceramic multilayer substrate, and the terminal electrode is connected to the conductive pattern provided for the ceramic multilayer substrate via a via conductor provided in the resin portion.

Preferably, a region in which a conductive pattern is not provided at the interface between the resin portion and the ceramic substrate and on the bottom surface of the cavity is provided from an inside wall surface of the cavity, which is used as the center, to a position at least about 150 μm from the inside wall surface of the cavity in every direction.

According to preferred embodiments of the present invention, a hybrid multilayer substrate and a method for manufacturing the same are provided, the hybrid multilayer substrate having high positional accuracy of terminal electrodes provided in the bottom surface of the cavity and being capable of significantly improving the reliability of connection with a mounted component.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1A is a cross-sectional view of the entire substrate; and FIG. 1B is a cross-sectional view showing the state before a chip type electronic component is sealed with a resin.

DETAILED DESCRIPTION OF PREFERRED EMBODIMENTS

Hereinafter, the present invention will be described with reference to preferred embodiments shown in FIGS. 1A to 10.

Figure 1A:
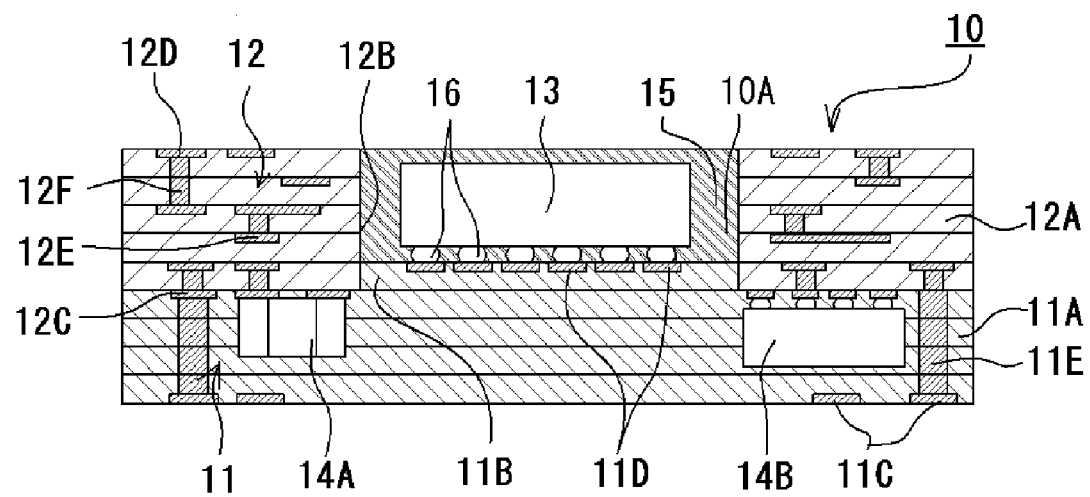
FIGS. 1A and 1B are views showing one preferred embodiment of a hybrid multilayer substrate according to the present invention.

A hybrid multilayer substrate 10 of this preferred embodiment includes, as shown in FIG. 1A by way of example, a cavity 10A in a laminate structure which includes a resin portion 11 and a ceramic substrate 12 laminated thereon, and is mounted on a mounting substrate (not shown), such as a printed circuit board, with the resin portion 11 provided therebetween. In addition, when the hybrid multilayer substrate 10 is mounted on a ceramic-made substrate, mounting may be performed with the ceramic substrate 12 provided therebetween. Since the mounting substrate, such as a printed circuit board, is made of a resin in many cases, the resin portion 11 is preferably made of a resin having a thermal expansion coefficient between the thermal expansion coefficient of the ceramic substrate 12 and that of the mounting substrate, such as an intermediate thermal expansion coefficient therebetween, or a resin having a thermal expansion coefficient gradient therebetween. The resin portion 11 is provided between the ceramic substrate 12 and the mounting substrate to reduce the difference in thermal expansion between the hybrid multilayer substrate 10 and the mounting substrate, and as a result, the hybrid multilayer substrate 10 mounted on the mounting substrate is not easily removed therefrom even in a high temperature atmosphere. This resin portion 11 is configured to have a laminate structure including resin layers 11A laminated to each other as shown in the FIG. 1A, and the ceramic substrate 12 is configured as a ceramic multilayer substrate including ceramic layers 12A laminated to each other. Thus, hereinafter, the ceramic substrate 12 will be described as a ceramic multilayer substrate 12.

Figure 1B:
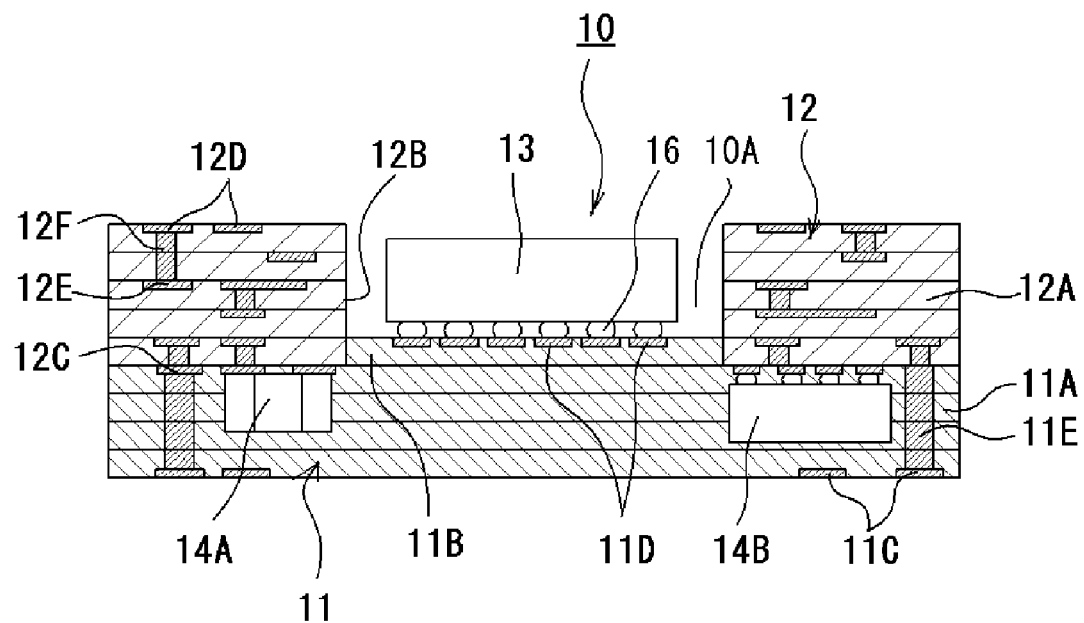

Subsequently, as shown in FIG. 1B, a protrusion portion 11B having a flat front surface is provided at a central portion of the upper surface of the resin portion 11, and a penetrating hole 12B corresponding to the protrusion portion 11B of the resin portion 11 is provided in the ceramic multilayer substrate 12. In addition, when the protrusion portion 11B of the resin portion 11 is fitted to a bottom end portion of the penetrating hole 12B of the ceramic multilayer substrate 12, the resin portion 11 and the ceramic multilayer substrate 12 are united, so that the cavity 10A of the hybrid multilayer substrate 10 is provided. The height of the protrusion portion 11B may be at least about 10 μm and is more preferably at least about 50 μm. When the height of the protrusion portion 11B is more than about 500 μm, since a protrusion region under the bottom surface of the cavity 10A is a useless region, the height of the protrusion portion 11B is preferably set to about 500 μm or less. Since the protrusion portion 11B of the resin portion 11 is fitted to the bottom end portion of the penetrating hole 12B of the ceramic multilayer substrate 12, a bonding strength between the resin portion 11 and the ceramic multilayer substrate 12 is improved, and as a result, the reliability as the hybrid multilayer substrate 10 is improved.

In the cavity 10A, a first chip type electronic component 13 is provided. In addition, since second chip type electronic components 14A and 14B mounted on the bottom surface of the ceramic substrate 12 are embedded in the resin portion 11, the resin portion 11 can be further effectively used as a mounting space for the second chip type electronic components 14A and 14B, and thus, functions of the hybrid multilayer substrate 10 are increased so as to satisfy the trend toward enhancement of multifunctionality.

In addition, a resin is filled in the cavity 10A, and by this resin, the first chip type electronic component 13 is sealed. This resin portion (hereinafter referred to as a "sealing resin portion") 15 has an upper surface that is substantially flush with the upper surface of the ceramic multilayer substrate 12, so that one flat surface is provided. As described above, since the first and second chip type electronic components 13, 14A, and 14B are respectively sealed with the resins, the first and the second chip type electronic components 13, 14A, and 14B are protected from external mechanical shock, moisture, and other environmental hazards.

Next, individual elements of the hybrid multilayer substrate 10 will be described in more detail. First, the resin portion 11 will be described. As shown in FIGS. 1A and 1B, external terminal electrodes 11Care provided in the bottom surface of the resin portion 11 so as to have a predetermined pattern, and electrical connection to the mounting substrate is performed via the external terminal electrodes 11C. External terminal electrodes 11D having a predetermined pattern are provided in the upper surface of the protrusion portion 11B of the resin portion 11 and are connected to the first chip type electronic component 13 disposed in the cavity 10A. In addition, via conductors 11E are provided in the resin portion 11 to connect between a conductive pattern of the ceramic multilayer substrate 12 and a conductive pattern of the mounting substrate. External terminal electrodes present at the bonding surface between the resin portion 11 and the ceramic multilayer substrate 12 are not provided at the resin portion 11 side for the reasons described below and are provided at the ceramic multilayer substrate 12 side.

The resin layer 11A is preferably made of a mixed resin composition including a thermosetting resin and an inorganic filler. As the thermosetting resin, for example, an epoxy resin, a phenol resin, or a cyanate resin, which has superior heat resistance and humidity resistance, may be used, and as the inorganic filler, for example, alumina, silica, or titania may be used. With the addition of the inorganic filler as described above, the thermal expansion coefficient of the resin portion 11 can be adjusted, and heat dissipation properties thereof can be improved. In addition, the viscosity of the resin can be appropriately controlled when the resin portion 11 is manufactured.

The external terminal electrodes 11C and 11D of the resin portion 11 are preferably made of a metal foil, such as a copper foil. The via conductor 11E is formed by filling a conductive resin in a via conduction hole provided in the resin portion 11. The conductive resin is preferably a conductive resin composition including, for example, metal particles and a thermosetting resin. As the metal particles, for example, a metal, such as gold, silver, copper, or nickel, may be used, and as the thermosetting resin, for example, an epoxy resin, a phenol resin, or a cyanate resin may be used. In addition, whenever necessary, the via conductor 11E may be formed, for example, of electroless plating copper and electrolytic plating copper.

Next, the ceramic multilayer substrate 12 will be described. As shown in FIGS. 1A and 1B, external terminal electrodes 12C having a predetermined pattern is provided on the bottom surface of the ceramic multilayer substrate 12, and the ceramic multilayer substrate 12 is connected to the via conductors 11E of the resin portion 11 via the external terminal electrodes 12C. External terminal electrodes 12D having a predetermined pattern are provided in the upper surface of the ceramic multilayer substrate 12, and a third chip type electronic component (not shown) can be mounted via the external terminal electrodes 12D. Furthermore, in-plane conductors 12E having a predetermined pattern are provided in the individual ceramic layers 12A of the ceramic multilayer substrate 12, and the in-plane conductors 12E adjacent in an up and down direction are connected to each other via conductors 12F having a predetermined pattern. The external terminal electrodes 12C and 12D, the in-plane conductors 12E, and the via conductors 12F are connected to each other, so that a conductive pattern of the ceramic multilayer substrate 12 is provided.

The ceramic layer 12A is made of a ceramic material. Although the ceramic material is not particularly limited, for example, a low temperature sintered ceramic (LTCC: Low Temperature Co-fired Ceramic) material may be preferably used. The low temperature sintered ceramic is a ceramic material which can be fired at a temperature of about 1,050° C. or less. As the low temperature sintered ceramic material, for example, a glass composite-based LTCC material containing powdered ceramic, such as alumina, forsterite, or cordierite, and borosilicate glass mixed therewith; a crystalline glass-based LTCC material using a ZnO—MgO—Al$_2$O$_3$—SiO$_2$-based crystalline glass; or a non-glass-based LTCC material using a powdered BaO—Al$_2$O$_3$—SiO$_2$-based ceramic, a powdered Al$_2$O$_3$—CaO—SiO$_2$—MgO—B$_2$O$_3$-based ceramic, or other suitable material may be used.

When a low temperature sintered ceramic material is used for the ceramic multilayer substrate 12, as a conductive material for the external terminal electrodes 12C, 12D, for example, a metal, such as silver (Ag), copper (Cu), or gold (Au), having a low resistance and a low melting point can be used and can be fired at a low temperature simultaneously with the ceramic layers 12A so as to be united therewith. Hence, the conductive patterns of the external terminal electrodes 12C, 12D are formed of a sintered metal. In addition, by using the low temperature sintered ceramic material, a passive element, such as a capacitor or an inductor, which is made of a ceramic sintered body used as a base body obtained by firing at a temperature higher than that of the low temperature sintered ceramic material, can be embedded in the ceramic multilayer substrate 12.

Since the ceramic multilayer substrate 12 is preferably made of a low temperature sintered ceramic material as described above and has a surface roughness Rmax (several micrometers) approximately equivalent to that of a copper foil, the bonding force to the resin portion 11 is not strong. Thus, in this preferred embodiment, the external terminal electrode 12C connecting between the ceramic multilayer substrate 12 and the resin portion 11 is preferably made of a sintered metal as described above. The sintered metal of the external terminal electrode 12C preferably has a surface roughness Rmax of several tens of micrometers, which is greater by one order of magnitude than that of a copper foil which has a surface roughness Rmax of several micrometers, and thus, the bonding force to the resin portion 11 is increased by an anchor effect of the sintered metal. The difference in surface roughness as described above is due to the following reason. The copper foil is formed by plating or rolling of a copper sheet, and on the other hand, the sintered metal is formed by firing a conductive paste containing about 10% to about 40% of a resin component on a volume ratio basis.

Thus, the resin component is burned out to form voids inside or on the surface, and as a result, the surface roughness is increased.

The first chip type electronic component 13 is disposed on and connected to the external terminal electrodes 11D provided in the upper surface of the protrusion portion 11B of the resin portion 11 via solder balls 16. Since the protrusion portion 11B of the resin portion 11 is fitted in the penetrating hole 12B of the ceramic multilayer substrate 12, when the resin portion 11 and the ceramic multilayer substrate 12 are thermocompression-bonded together, the protrusion portion 11B is secured by the penetrating hole 12B so that the flow of the resin of the protrusion portion 11B is prevented or suppressed, and as a result, the shift in position of the external terminal electrodes 11D provided in the upper surface of the protrusion portion 11B is prevented or suppressed as much as possible. Thus, the external terminal electrodes 11D located at a mounting surface for the first chip type electronic component 13 can be formed substantially as designed to be disposed with high accuracy. As the first chip type electronic component 13, for example, an active chip component, such as a semiconductor chip, or a passive chip component, such as a laminate capacitor or a laminate inductor, may be provided.

Figure 2A:
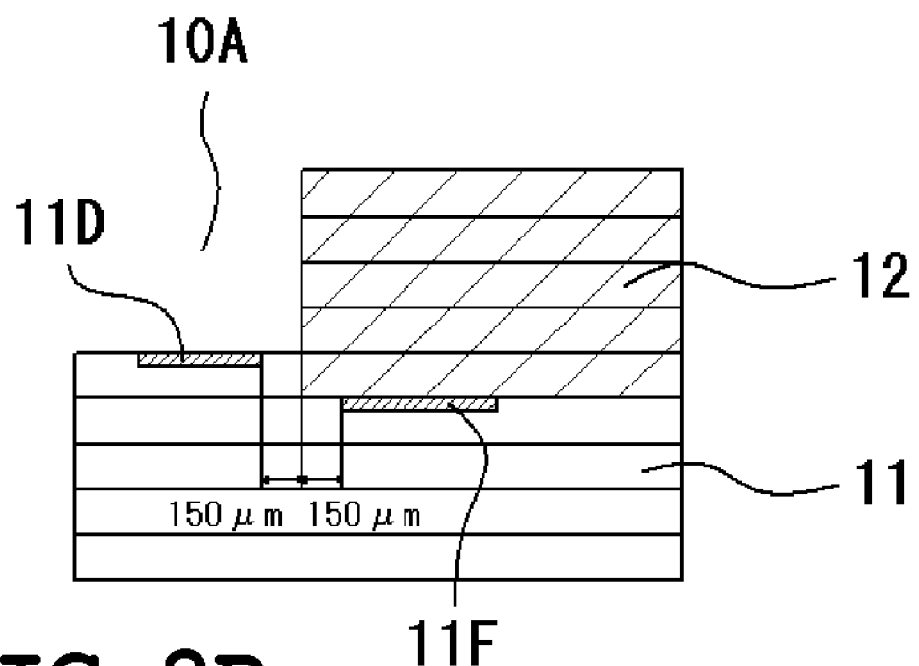
FIGS. 2A and 2B are views illustrating an arrangement of electrodes provided in a bottom surface of a cavity provided in the hybrid multilayer substrate shown in FIGS. 1A and 1B.
Figure 2B:
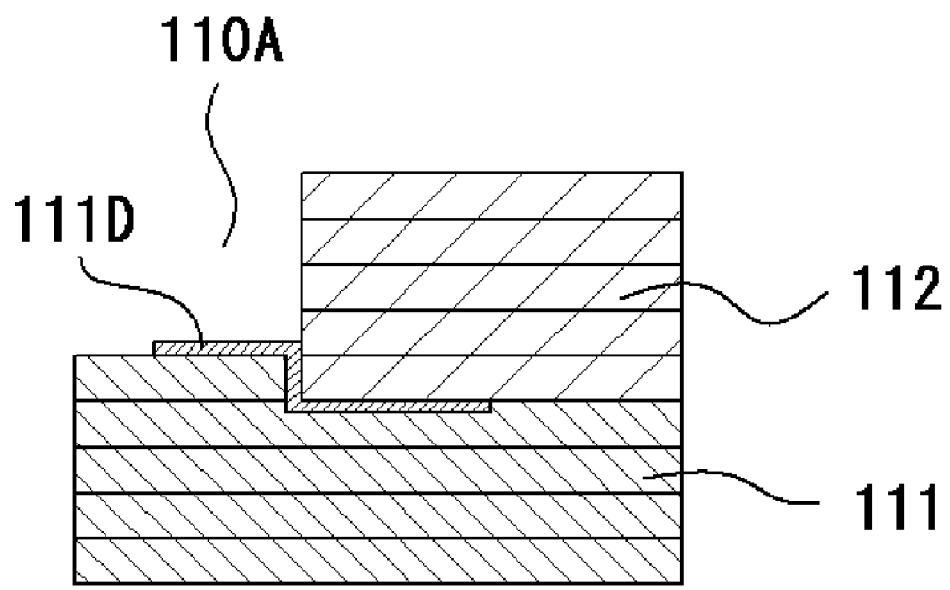

In addition, as shown in FIG. 2A, at the interface between the resin portion 11 and the ceramic multilayer substrate 12 and on the bottom surface of the cavity 10A, a region, in which a conductive pattern of the external terminal electrodes 11D is not provided, is arranged to extend from the inside wall surface of the cavity 10A, which is used as the center, to a position at least about 150 µm from the inside wall surface of the cavity 10A in every direction. As shown in FIG. 2B, when it is assumed that a conductive pattern is continuously disposed in an area extended from the inside wall surface of a cavity 110A, which is used as the center, to a position less than about 150 µm from the inside wall surface of the cavity 110A in every direction, a conductive pattern 111D may be cut off when a resin portion 111 and a ceramic multilayer substrate 112 are thermocompression-bonded, or wire breakage may occur by bending, resulting in conduction failure. In addition, as shown in FIG. 2A, when a conductive pattern 11F of the resin portion 11 is present at the interface between the resin portion 11 and the ceramic multilayer substrate 12, since the conductive pattern 11F of the resin portion 11 is made of a copper foil, the bonding force between the resin portion 11 and the ceramic multilayer substrate 12 is decreased, and in addition, moisture is likely to enter through the interface between the portion 11 and the substrate 12. Thus, the reliability may be degraded.

In addition, since the second chip type electronic components 14A and 14B are embedded in the resin portion 11 which is not necessarily to be fired, besides passive chip components, active chip components can be provided in the resin portion 11 as the second chip type electronic components 14A and 14B, and the multifunctionality is facilitated. In this preferred embodiment, as the second chip type electronic component 14A, for example, a passive chip component, such as a laminate capacitor or a laminate inductor, is provided, and as the second chip type electronic component 14B, for example, an active chip component, such as a semiconductor chip, is provided.

In addition, as is the case of the resin portion 11, a resin defining a sealing resin portion 15 is preferably made of a mixed resin composition including a thermosetting resin and an inorganic filler.

Next, a method for manufacturing the hybrid multilayer substrate 10 shown in FIGS. 1A and 1B will be described with reference to FIGS. 3A to 6. First, a method for forming a ceramic multilayer substrate 11 will be described. A slurry including, for example, a low temperature sintered ceramic material is first applied on resin films made of PET or other suitable material and is then dried, so that a predetermined number of ceramic green sheets having a thickness of approximately 10 µm to approximately 200 µm are formed.

Next, by using a die or laser light, a plurality of via conduction holes having a diameter of approximately 0.1 mm are formed in the ceramic green sheets so as to have a predetermined pattern. In addition, for example, a conductive paste prepared by compounding a powdered metal primarily composed of Ag or Cu, a resin, and an organic solvent is filled in the via conduction holes in the ceramic green sheets, followed by drying, so that via conduction portions are formed. Furthermore, the same type conductive paste as described above is printed on the ceramic green sheet to form a predetermined pattern by a screen printing method, followed by drying, so that plane conduction portions used as a surface electrode and an in-plane conductor are formed. In the same manner as described above, via conduction portions and plane conduction portions are formed in the other ceramic green sheets. Penetrating holes for the cavity 12B are formed in the above ceramic green sheets using a die, laser light, or other suitable method.

Figure 3A:
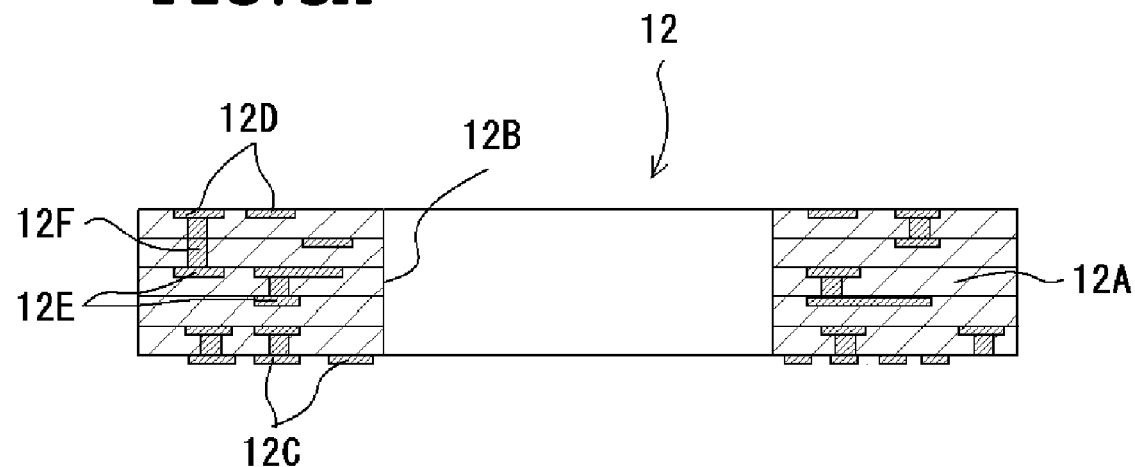
FIGS. 3A and 3B are views illustrating a step of mounting a chip type electronic component on a ceramic substrate of the hybrid multilayer substrate shown in FIGS. 1A and 1B.

Next, after a predetermined number of the ceramic green sheets formed as described above are laminated to each other, thermocompression bonding is performed at a predetermined pressure, such as about 0.1 MPa to about 1.5 MPa, and at a temperature of about 40° C. to about 100° C., so that a green ceramic multilayer substrate having a penetrating hole for the cavity 10A is formed. This green ceramic multilayer substrate is fired, so that the ceramic multilayer substrate 12 having the penetrating hole 12B shown in FIG. 3A is obtained. When a Ag-based conductive paste is used, the green ceramic multilayer substrate is fired in air at approximately 850° C., and when a Cu-based conductive paste is used, the green ceramic multilayer substrate is fired in an nitrogen gas at approximately 950° C. After the ceramic multilayer substrate 12 is obtained, whenever necessary, films are formed, for example, by wet plating of Ni/Sn, Ni/Au, or other suitable material on the surfaces of the external terminal electrodes 12C and 12D which are exposed at the top and the bottom surfaces of the ceramic multilayer substrate 12. By the sequential steps described above, the ceramic multilayer substrate 12 shown in FIG. 3A is obtained.

Figure 3B:
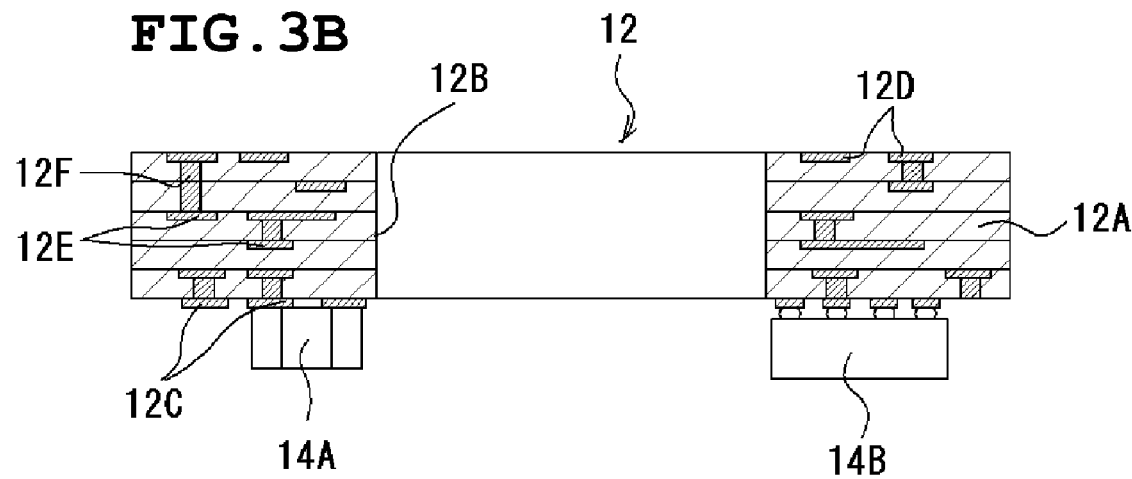

Subsequently, after the external terminal electrodes 12C on the bottom surface of the ceramic multilayer substrate 12 and the second chip type electronic components 14A and 14B are aligned, the second chip type electronic components 14A and 14B are mounted on the ceramic multilayer substrate 12 with a bonding material, such as solder, provided therebetween as shown in FIG. 3B.

Figure 4A:
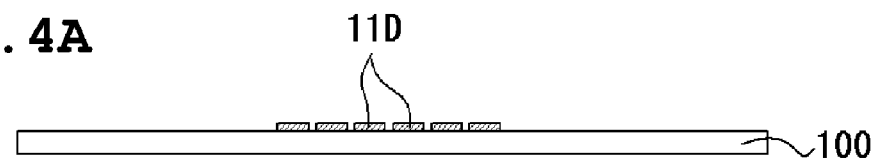
FIGS. 4A to 4D are views illustrating a step of forming a resin portion of the hybrid multilayer substrate shown in FIGS. 1A and 1B.
Figure 4B:
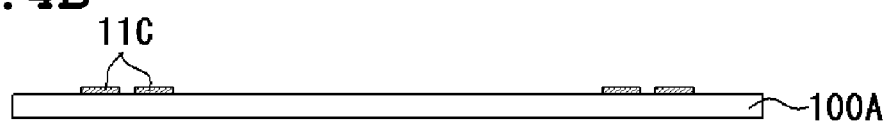

In addition, the resin portion 11 is formed as shown in FIGS. 4A to 4D. The external terminal electrodes 11D located at the protrusion portion 11B of the resin portion 11, that is, which is used as the bottom surface of the cavity 10A, and the external terminal electrodes 11C located at the bottom surface of the resin portion 11 are formed. For this formation, after a metal foil, such as a copper foil, having a thickness of approximately about 10 µm to about 40 µm is adhered to a support 100 made of PET or other suitable material as shown in FIG. 4A, a resist layer is formed on the copper foil by applying a photoresist and is then exposed using a predetermined pattern, and subsequently an unnecessary resist layer is removed by development. Then, after an unnecessary copper foil portion is removed by an etching treatment, a resist film is peeled away, so that as shown in the above figure, the external terminal electrodes 11D are formed on the support 100 to have a predetermined pattern. The external terminal electrodes 11D are formed so as to be located in a region at least about 150 μm from the periphery of the protrusion portion 11B of the resin portion 11. In addition, in a manner similar to that described above, the external terminal electrodes 11C are formed on a support 100A made of a PET or other suitable material so as to have a predetermined pattern as shown in FIG. 4B.

Figure 4C:
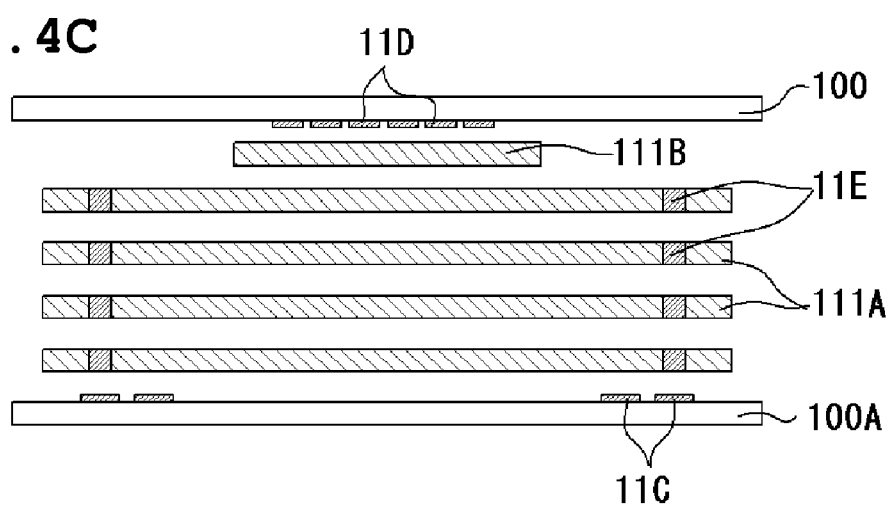
Figure 4D:
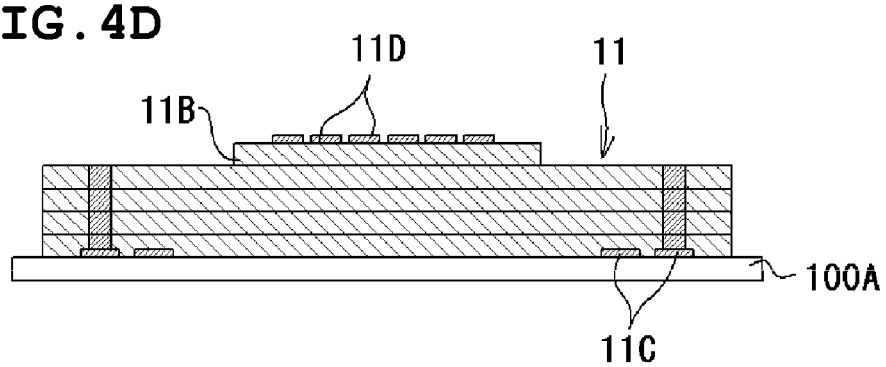

Next, as shown in FIG. 4C, a predetermined number of resin sheets 111A in a prepreg state obtained by mixing a thermosetting resin, such as an epoxy resin, and an inorganic filler, such as alumina, are formed, and in addition, a resin sheet 111B to be formed into the protrusion portion 11B is also formed. Via conduction holes having a predetermined pattern are formed in the resin sheets 111A using laser light or other suitable method, and a conductive resin is filled in these via conduction holes, so that the via conductors 11E are formed. Subsequently, as shown in FIG. 4C, after a support 110A having the external terminal electrodes 11C, a predetermined number of the resin sheets 111A having the via conductors 11E, the resin sheet 111B, and the support 100 having the external terminal electrodes 11D are laminated in that order while alignment therebetween is being performed, compression bonding is performed at a predetermined pressure, followed by removing the support 100. Accordingly, as shown in FIG. 4D, the external terminal electrodes 11D on the support 100 are transferred to the resin sheet 111B, and the resin portion 11 having the protrusion portion 11B is obtained.

Figure 5A:
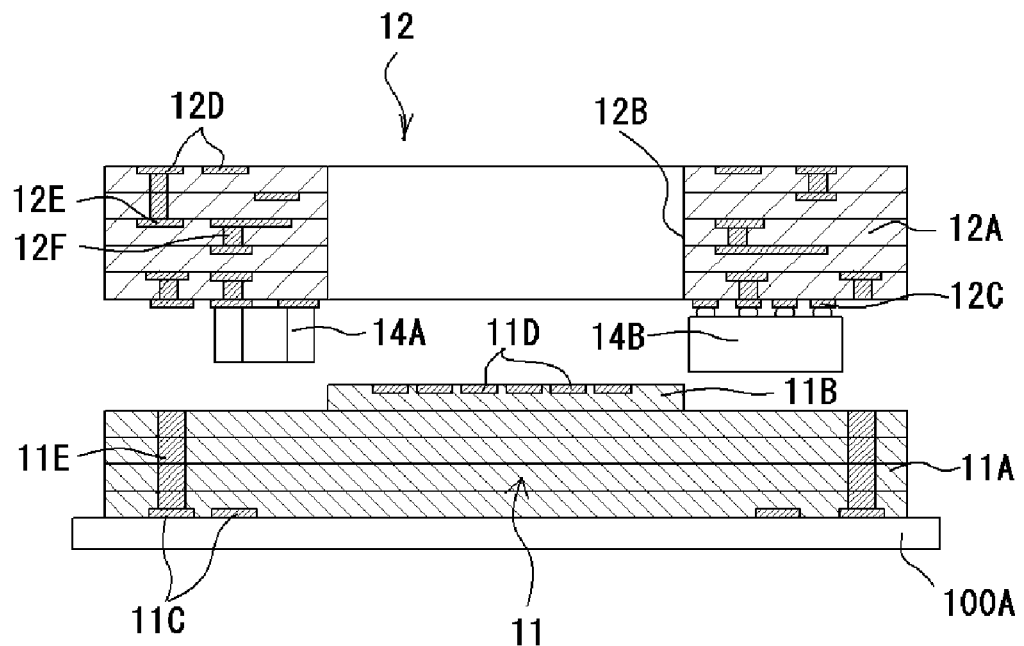
FIGS. 5A and 5B are views illustrating a step of performing thermocompression bonding between a resin portion and a ceramic substrate of the hybrid multilayer substrate shown in FIGS. 1A and 1B.
Figure 5B:
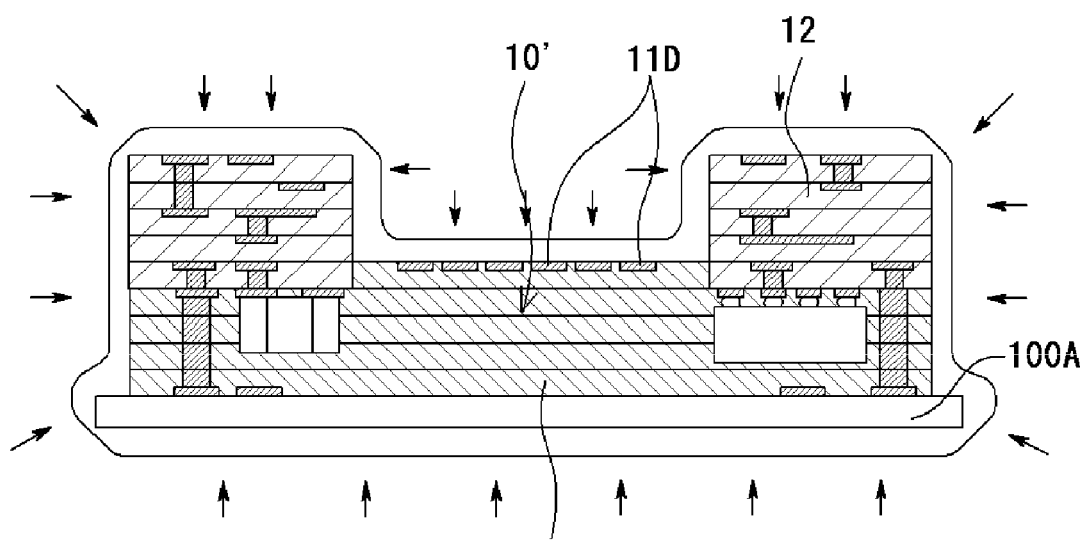

Subsequently, as shown in FIG. 5A, when the penetrating hole 12B of the ceramic multilayer substrate 12 and the protrusion portion 11B of the resin portion 11 are aligned at the upper side of the resin portion 11 provided on the support 100A and are then thermocompression-bonded at a thermosetting temperature of the resin, the protrusion portion 11B is fitted to the penetrating hole 12B, and in addition, the second chip type electronic components 14A and 14B are embedded in the resin portion 11. In this step, since the protrusion portion 11B is secured by the penetrating hole 12B, the resin forming the protrusion portion 11B does not flow substantially, and a resin other than that of the protrusion portion 11B flows and forms the resin portion 11. Thus, the external terminal electrodes 11D of the protrusion portion 11B does not substantially shift in the horizontal direction, and as a result, a flat pattern is formed that is close to as designed. When the thermocompression bonding is performed, a vacuum laminator is preferably used as shown in FIG. 5B in which a flexible member or other suitable instrument performs isotropic pressing in conformity with the shape of the laminate formed of the resin portion 11 and the ceramic multilayer substrate 12. When the isotropic pressing is performed, by supporting the laminate with a flat member (support 100A), such as a metal plate as shown in FIG. 5B, a hybrid multilayer substrate 10' is obtained which has superior flatness and which is made of the resin portion 11 and the ceramic multilayer substrate 12.

Figure 6:
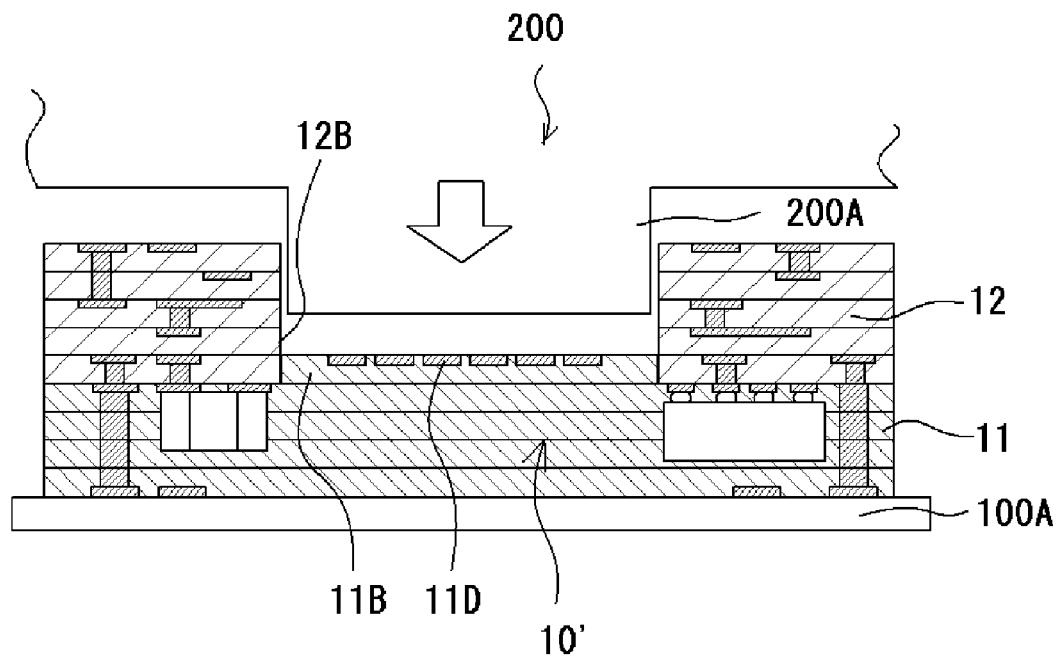
FIG. 6 is a view showing an important portion of another manufacturing step of the hybrid multilayer substrate shown in FIGS. 1A and 1B.

In addition, when a press mold 200 having a protrusion portion 200A is used as shown in FIG. 6, instead of the isotropic pressing, and when pressing is performed while the protrusion portion 200A is fitted to the penetrating hole 12B of the ceramic multilayer substrate 12, the resin portion 11 and the ceramic multilayer substrate 12 can be thermocompression-bonded. In this step, since the external terminal electrodes 11D provided in the upper surface of the protrusion portion 11B of the resin portion 11 are formed in a region at least 150 μpm from the periphery of the protrusion portion 11B, the external terminal electrodes 11D may not be damaged. In addition, when a multistage press mold having a plurality of protrusion steps is used as the press mold, the protrusion portion 11B of the resin portion 11 can be formed to have a plurality of steps.

Next, the first chip type electronic component 13, such as a semiconductor chip, is mounted in the cavity 10A of the hybrid multilayer substrate 10'. In this step, since the mounting surface for the first chip type electronic component 13 is formed from the resin so as to be flat without having any steps, and in addition, the external terminal electrodes 11D are not shifted, the arrangement of the first chip type electronic component 13 in the cavity 10A is stable, and thus, the first chip type electronic component 13 can be reliably mounted with high accuracy without causing any connection failures or other problems. In addition, when flip chip connection is performed, chipping will not occur, and when reflow is performed, mounting can be performed with high accuracy by self-alignment.

After the first chip type electronic component 13 is mounted, a resin is filled in a gap in the cavity 10A, and after the first chip type electronic component 13 is sealed as shown in FIG. 1A, a predetermined heat treatment is performed, so that the sealing resin portion 15 is formed.

As described above, according to this preferred embodiment, since the resin portion 11 having the protrusion portion 11B and the ceramic multilayer substrate 12 having the penetrating hole 12B form a laminate structure, and the cavity 10A of the hybrid multilayer substrate 10 is formed by fitting the protrusion portion 11B of the resin portion 11 to the bottom end portion of the penetrating hole 12B of the ceramic multilayer substrate 12, the bonding force between the resin portion 11 and the ceramic multilayer substrate 12 is increased, and the external terminal electrodes 11D in the bottom surface of the cavity 10A can be accurately formed as designed. Thus, the hybrid multilayer substrate 10 achieves a reduction in size and an increase in the number of pins of the first chip type electronic component 13, and the reliability as the hybrid multilayer substrate 10 is improved. In addition, since the first chip type electronic component 13 is mounted in the cavity 10A, self-alignment mounting of the first chip type electronic component 13 can be performed. In addition, since the bottom surface of the cavity 10A is planarized by the resin, the first chip type electronic component 13 is stably supported on the bottom surface used as the mounting surface, and thus, electrical connection by wire bonding or other suitable method can be reliably performed. Also in the case in which flip-chip connection is performed for the first chip type electronic component 13, a plurality of connection terminals thereof can reliably extend to the external terminal electrodes 11D in the protrusion portion 11B and can be reliably connected thereto, and thus, chipping and/or connection failures of flip-chip assembly does not occur during mounting.

In addition, according to this preferred embodiment, since the first chip type electronic component 13 is disposed in the cavity 10A, a reduction in the height of the hybrid multilayer substrate 10 is achieved. In addition, since the first chip type electronic component 13 disposed in the cavity 10A is sealed by the sealing resin portion 15, the first chip type electronic component 13 is protected from external mechanical shock, moisture, and other environmental hazards, and thus, the reliability is improved. Since the ceramic multilayer substrate 12 is made of the ceramic layers 12A laminated to each other, and conductive patterns of the external terminal electrodes 12C and 12D, the in-plane conductors 12E, and the via conductors 12F are provided in the ceramic multilayer substrate 12 and on the surfaces thereof, a region surrounding the first chip type electronic component 13 can be effectively used as a wiring region, and thus, the reduction in the height of the hybrid multilayer substrate 10 is facilitated.

In addition, since the resin portion 11 includes the external terminal electrodes 11C in the surface opposite to the surface bonded to the ceramic multilayer substrate 12, and the external terminal electrodes 11C are connected to the external terminal electrodes 12C, that is, to the conductive pattern provided on the ceramic multilayer substrate 12, via the via conductors 11E provided in the resin portion 11, the conductive pattern of the ceramic multilayer substrate 12 and the conductive pattern of the mounting substrate can be reliably connected to each other via the via conductors 11E of the resin portion 11. As a result, the first and the second chip type electronic components 13, 14A, and 14B can be reliably connected to the mounting substrate, such that the enhancement of multifunctionality of the substrate is achieved.

In addition, according to this preferred embodiment, since the ceramic multilayer substrate 12 is made of the low temperature sintered ceramic layers 12A laminated to each other, and the conductive pattern thereof is made of a conductive material primarily composed of silver or copper, the ceramic multilayer substrate 12 and the conductive pattern can be co-fired at a low temperature of about 1,050° C. or less. Thus, even by the low temperature firing, a conductive pattern having low resistance is reliably provided.

In addition, since the region, in which the conductive patterns of the external terminal electrodes 11D are not provided at the interface between the resin portion 11 and the ceramic multilayer substrate 12 and on the bottom surface of the cavity 10A, is provided from the inside wall surface of the cavity 10A, which is used as the center, to a position at least about 150 μm therefrom in every direction, moisture intrusion and connection defects do not occur. Thus, a highly reliable conductive pattern is provided.

In addition, according to this preferred embodiment, when the hybrid multilayer substrate 10 is manufactured, respective steps are provided for forming the resin portion 11 having the protrusion portion 11B and for forming the ceramic multilayer substrate 12 having the penetrating hole 12B, and the step of bonding the resin portion 11 to the ceramic multilayer substrate 12 so as to fit the protrusion portion 11B of the resin portion 11 to the end portion of the penetrating hole 12B of the ceramic multilayer substrate 12. Accordingly, the resin portion 11 and the ceramic multilayer substrate 12 are united to form the cavity 10A in which the upper surface of the protrusion portion 11B is used as the bottom surface. As a result, the hybrid multilayer substrate 10 can be reliably manufactured.

Next, other preferred embodiments of the hybrid multilayer substrate according to the present invention will be described with reference to FIGS. 7 to 10. In the following description, characteristic portions of the preferred embodiments will be described using a reference numeral which is increased by 10 in each preferred embodiment.

Figure 7:
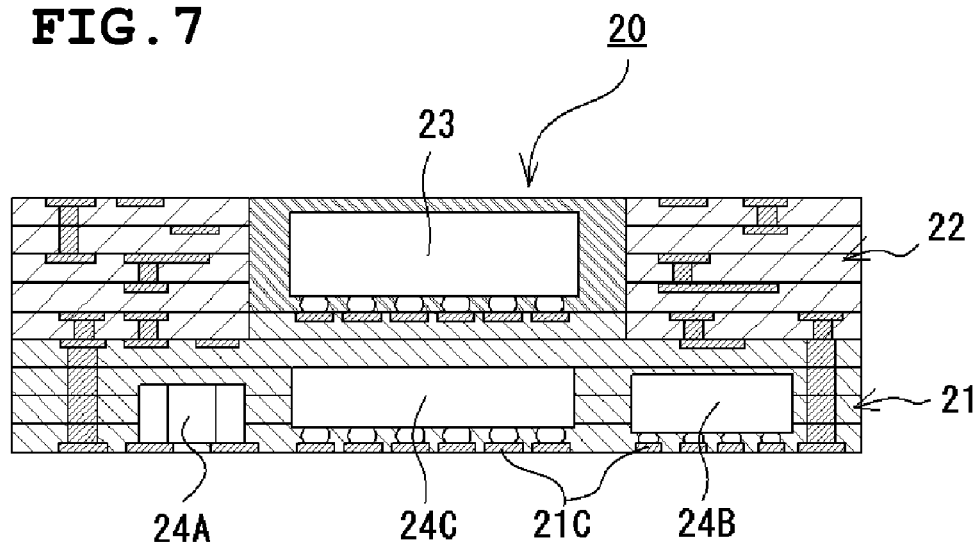
FIG. 7 is a cross-sectional view showing another preferred embodiment of a hybrid multilayer substrate according to the present invention.

As in the hybrid multilayer substrate 10 shown in FIG. 1A, a hybrid multilayer substrate 20 shown in FIG. 7 includes a resin portion 21, a ceramic multilayer substrate 22, and first and second chip type electronic components 23, 24A, and 24B. In addition, in this preferred embodiment, a second chip type electronic component 24C is mounted in the resin portion 21 under the first chip type electronic component 23, so that a region of the resin portion 21 under the first chip type electronic component 23 is effectively used. In addition, the second chip type electronic components 24A, 24B, and 24C are mounted to external terminal electrodes 21C provided in the bottom surface of the resin portion 21. Except for the above two points described above, the hybrid multilayer substrate 20 has a structure that is similar to that of the hybrid multilayer substrate 10 shown in FIG. 1A. According to this preferred embodiment, since the region of the resin portion 21 under the first chip type electronic component 23 can be effectively used for mounting the second chip type electronic component 24C, the multifunctionality is enhanced as compared to the hybrid multilayer substrate 10 shown in FIG. 1A.

Figure 8:
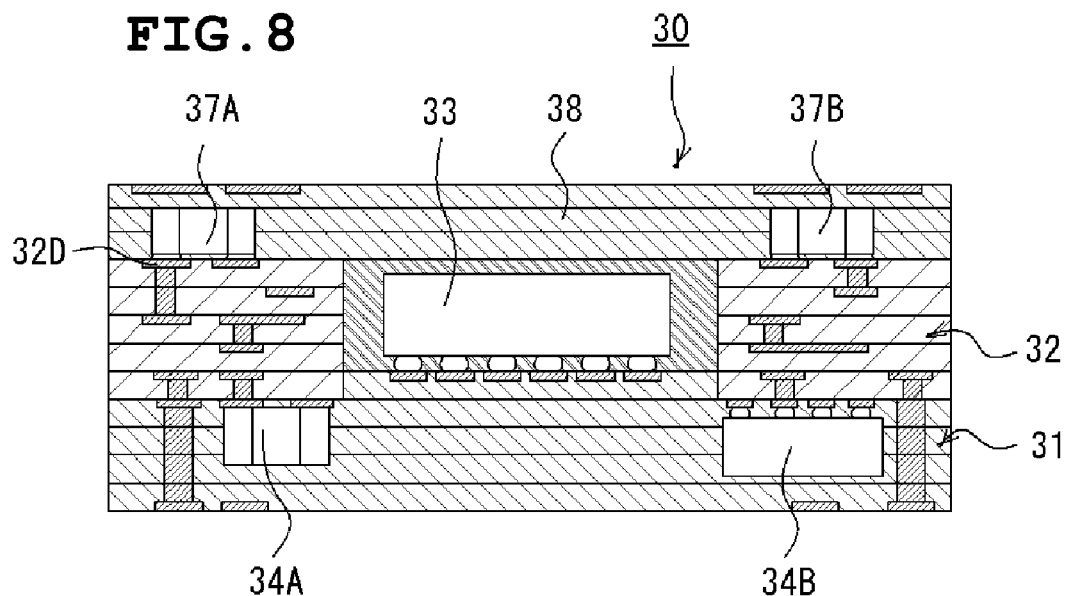
FIG. 8 is a cross-sectional view showing still another preferred embodiment of a hybrid multilayer substrate according to the present invention.

As in the hybrid multilayer substrate 10 shown in FIG. 1A, a hybrid multilayer substrate 30 shown in FIG. 8 includes a resin portion 31, a ceramic multilayer substrate 32, and first and second chip type electronic components 33, 34A, and 34B. In addition, the hybrid multilayer substrate 30 of this preferred embodiment includes third chip type electronic components 37A and 37B mounted on the upper surface of the ceramic multilayer substrate 32 via external terminal electrodes 32D, and a second sealing resin portion 38 sealing the third chip type electronic components 37A and 37B. Except for those points described above, the hybrid multilayer substrate 30 has a structure that is similar to that of the hybrid multilayer substrate 10 shown in FIG. 1A. As the third chip type electronic components 37A and 37B, for example, an active chip component, such as a semiconductor chip, and a passive chip component, such as a laminate capacitor or a laminate inductor, can be mounted.

According to this preferred embodiment, since the third chip type electronic components 37A and 37B are mounted on the surface (upper surface) of the ceramic multilayer substrate 32, compared to the case of the above-described preferred embodiment, the hybrid multilayer substrate 30 has further enhanced multifunctionality. In addition, since being covered with the second sealing resin portion 38, the third chip type electronic components 37A and 37B is reliably protected from exterior moisture and other environmental hazards.

Figure 9:
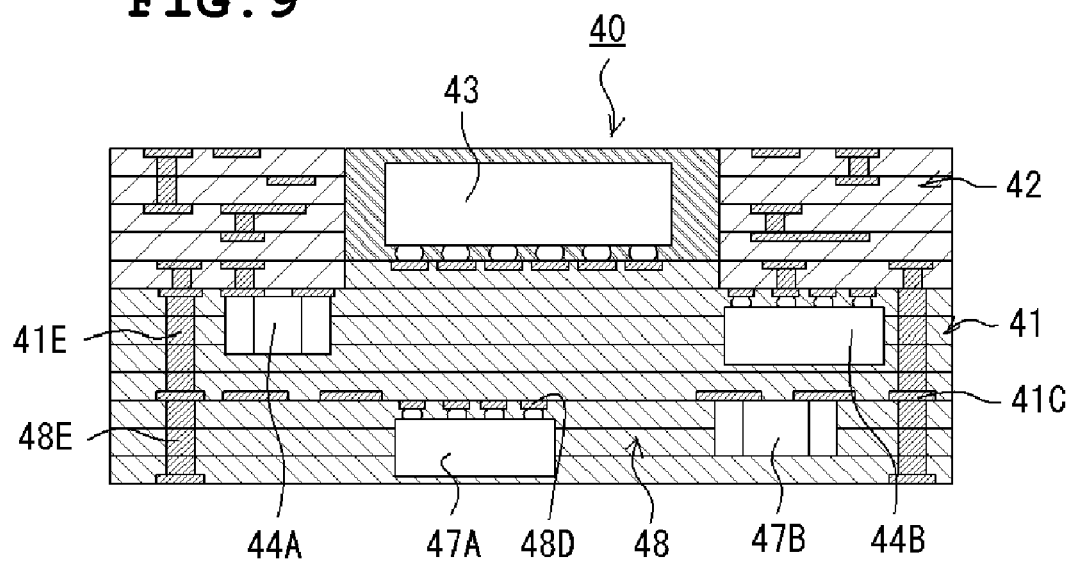
FIG. 9 is a cross-sectional view showing still another preferred embodiment of a hybrid multilayer substrate according to the present invention.

As is the hybrid multilayer substrate 10 shown in FIG. 1A, a hybrid multilayer substrate 40 shown in FIG. 9 includes a resin portion 41, a ceramic multilayer substrate 42, and first and second chip type electronic components 43, 44A, and 44B. In addition, the hybrid multilayer substrate 40 of this preferred embodiment includes a second resin portion 48 provided on the bottom surface of the resin portion 41 and third chip type electronic components 47A and 47B provided in this second resin portion 48, and the resin portion 41 and the second resin portion 48 define a resin laminate. Except that the third chip type electronic components 47A and 47B and the second resin portion 48 are provided, the hybrid multilayer substrate 40 has a structure that is similar to that of the hybrid multilayer substrate 10 shown in FIG. 1A. For example, the resin portion 41 and the second resin portion 48 may include the same resin component or may include different resin components. The third chip type electronic component 47A is connected, for example, to external terminal electrodes 48D provided on an upper surface of the second resin portion 48, and the third chip type electronic component 47B is connected, for example, to external terminal electrodes 41C provided on a bottom surface of the resin portion 41. In this figure, reference numeral 48E indicates a via conductor provided in the second resin portion 48, and this via conductor 48E connects between the via conductor 41E of the resin portion 41 and a mounting substrate. As the third chip type electronic components 47A and 47B, for example, an active chip component, such as a semiconductor chip, and a passive chip component, such as a laminate capacitor or a laminate inductor, are provided. In this preferred embodiment, effects and advantages similar to those of the hybrid multilayer substrate 30 shown in FIG. 8 are achieved.

Figure 10:
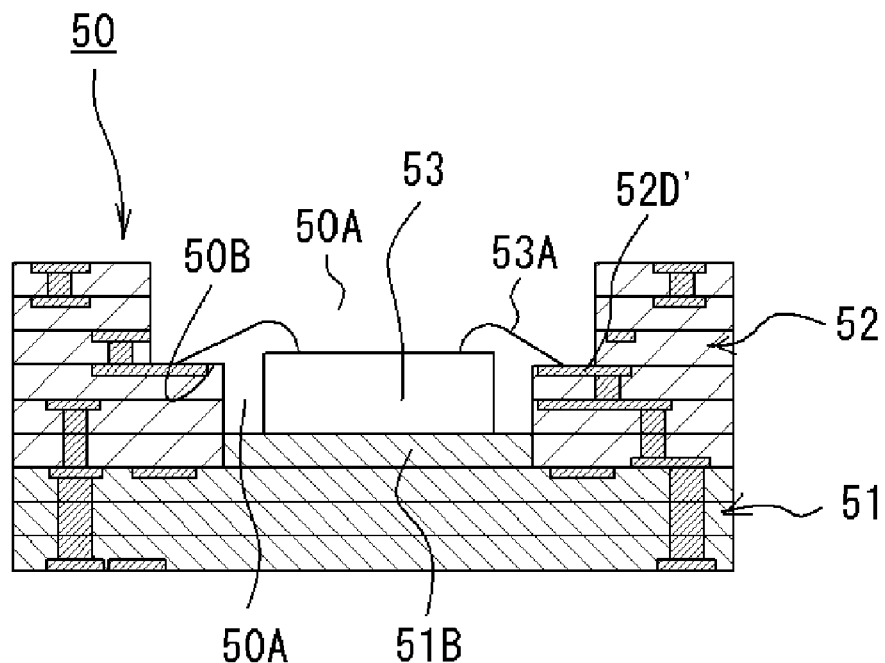
FIG. 10 is a cross-sectional view showing still another preferred embodiment of a hybrid multilayer substrate according to the present invention.
Figure 11:
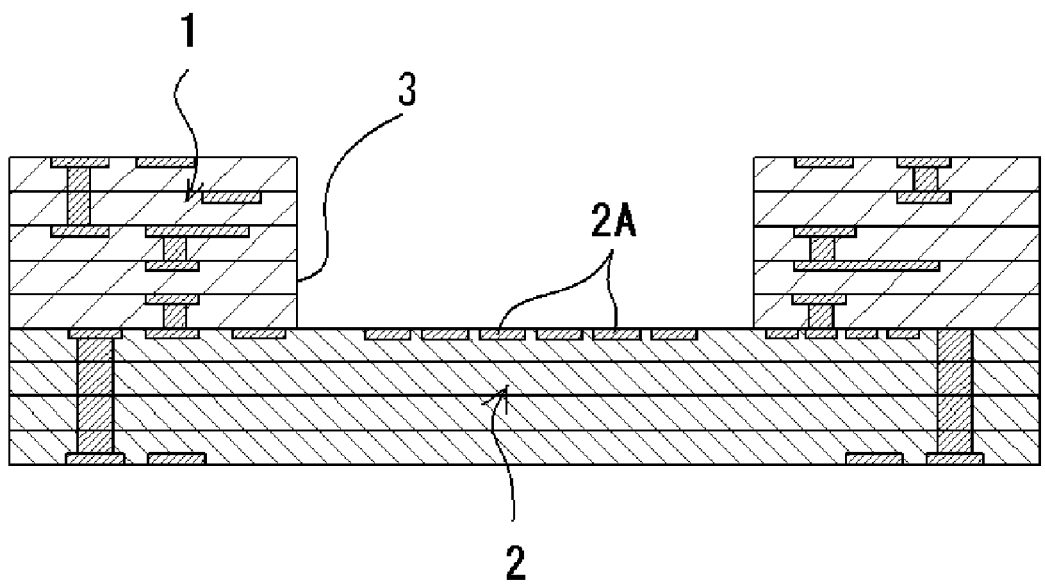
FIG. 11 is a cross-sectional view showing a conventional multilayer substrate having a cavity before a chip type electronic component is mounted therein.

In addition, a hybrid multilayer substrate 50 shown in FIG. 10 includes a resin portion 51, a ceramic multilayer substrate 52, and a first chip type electronic component 53, and has a structure that is similar to that of the hybrid multilayer substrate 10 shown in FIG. 1A, except that the first chip type electronic component 53 is connected to external terminal electrodes 52D' of the ceramic multilayer substrate 52 via bonding wires 53A. In this preferred embodiment, a cavity 50A is configured so as to have a larger opening from a central portion to the top of the inside wall surface along the height direction, and at a boundary portion between the top and the bottom portions, a flat step 50B of the ceramic multilayer substrate 52 is provided. In addition, the external terminal electrodes 52D' are provided in the upper surface of this step 50B, and the external terminal electrodes 52D' are connected to the first chip type electronic component 53 via the bonding wires 53A. Also in this preferred embodiment, since the bottom surface of the cavity 50A is defined by a protrusion portion 51B of the resin portion 51 and is flat, the first chip type electronic component 53 is stably supported in the cavity, and the first chip type electronic component 53 can be reliably connected to the external terminal electrodes 52D' of the ceramic multilayer substrate 52. In this preferred embodiment, effects and advantages similar to those of the hybrid multilayer substrates of the above preferred embodiments are achieved.

The present invention is not limited to the above preferred embodiments. For example, in the above preferred embodiments, the case in which the hybrid multilayer substrate is mounted on the mounting substrate with the resin portion provided therebetween has been described. However, the mounting can be performed using the ceramic substrate therebetween. For example, in the case of the hybrid multilayer substrate 30 shown in FIG. 8, whenever necessary, either the top or the bottom surface of the hybrid multilayer substrate 30 can be connected to the mounting substrate. That is, when a hybrid multilayer substrate has a laminate structure made of a resin portion and a ceramic substrate and includes a cavity, the resin portion has a protrusion portion, the ceramic substrate has a penetrating hole, and the cavity is formed by fitting the protrusion portion of the resin portion to an end portion of the penetrating hole of the ceramic substrate, the above hybrid multilayer substrate is included in the present invention.

The present invention can be preferably applied, for example, to a hybrid multilayer substrate used for various electronic apparatuses.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A hybrid multilayer substrate comprising:
   a cavity having a laminate structure made of a resin portion and a ceramic substrate; wherein
   the resin portion includes a protrusion portion and the ceramic substrate includes a penetrating hole;
   the cavity is defined by an upper surface of the protrusion portion of the resin portion and a wall surface of the penetrating hole of the ceramic substrate; and
   the upper surface of the protrusion portion of the resin portion includes external terminal electrodes provided thereon.

2. The hybrid multilayer substrate according to claim 1, wherein a first chip type electronic component is disposed in the cavity.

3. The hybrid multilayer substrate according to claim 2, wherein the first chip type electronic component disposed in the cavity is sealed with a resin.

4. The hybrid multilayer substrate according to claim 1, wherein the ceramic substrate is a ceramic multilayer substrate composed of ceramic layers laminated to each other, and a predetermined conductive pattern is provided inside the ceramic multilayer substrate and on a surface thereof.

5. The hybrid multilayer substrate according to claim 4, wherein each of the ceramic layers are made of a low temperature sintered ceramic layer, and the conductive pattern is made of a conductive material primarily composed of one of silver and copper.

6. The hybrid multilayer substrate according to claim 4, wherein a terminal electrode is provided in a surface of the resin portion opposite to the surface bonded to the ceramic multilayer substrate, and the terminal electrode is connected to the conductive pattern provided for the ceramic multilayer substrate via a via conductor provided in the resin portion.

7. The hybrid multilayer substrate according to claim 4, wherein a region in which a conductive pattern is not provided at the interface between the resin portion and the ceramic substrate and on the bottom surface of the cavity is provided from an inside wall surface of the cavity, which defines a center, to a position at least about 150 μm from the inside wall surface of the cavity in every direction.

* * * * *